(12) United States Patent  
Chen

(10) Patent No.: US 8,879,013 B2  
(45) Date of Patent: Nov. 4, 2014

(54) THIN-FILM TRANSISTOR LIQUID CRYSTAL DISPLAY DEVICE, SUBSTRATE, AND MANUFACTURING METHOD

(75) Inventor: Cheng-Hung Chen, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 180 days.

(21) Appl. No.: 13/503,374

(22) PCT Filed: Jan. 16, 2012

(86) PCT No.: PCT/CN2012/070367  
§ 371 (c)(1), (2), (4) Date: Apr. 23, 2012

(87) PCT Pub. No.: WO2013/097307  
PCT Pub. Date: Jul. 4, 2013

(65) Prior Publication Data  
US 2013/0162509 A1    Jun. 27, 2013

(30) Foreign Application Priority Data

Dec. 26, 2011    (CN) .......................... 2011 1 0439847

(51) Int. Cl.  
*G02F 1/136*    (2006.01)

(52) U.S. Cl.  
USPC .......... 349/46; 349/42; 349/43; 257/E29.116; 257/E29.12; 257/E29.112

(58) Field of Classification Search  
CPC ................... H01L 29/41733; H01L 29/41775; H01L 29/41758; H01L 29/41725; H01L 29/4175; H01L 29/4238; H01L 29/0847; H01L 29/41766; H01L 29/41; H01L 29/66628; H01L 29/78618; H01L 29/42316; H01L 29/66575  
See application file for complete search history.

(56) References Cited

U.S. PATENT DOCUMENTS 5,614,427 A * 3/1997 den Boer et al. ................ 438/30  
7,772,598 B2 * 8/2010 Choi et al. ...................... 257/84

* cited by examiner

*Primary Examiner* — Bumsuk Won  
*Assistant Examiner* — Angela Davison  
(74) *Attorney, Agent, or Firm* — Cheng-Ju Chiang

(57) ABSTRACT

A thin-film transistor liquid crystal display device includes: a substrate and a signal line, a scan line, a pixel electrode, and a thin-film transistor that are formed on the substrate. The signal line and the scan line are arranged to intersect each other. The pixel electrode is located in a pixel display zone enclosed by the intersected signal line and scan line. The thin-film transistor includes a gate terminal, a source terminal, and a drain terminal. The gate terminal is electrically connected to the scan line. The drain terminal is electrically connected to the signal line. The source terminal is arranged at a position corresponding to the intersection of the signal line and the scan line and is electrically connected to the pixel electrode.

8 Claims, 4 Drawing Sheets

THIN-FILM TRANSISTOR LIQUID CRYSTAL DISPLAY DEVICE, SUBSTRATE, AND MANUFACTURING METHOD

BACKGROUND OF THE INVENTION

1. Field of the Invention

The present invention relates to the technical field of thin-film transistor (TFT) liquid crystal display device, and in particular to a TFT liquid crystal display device, substrate, and manufacturing method.

2. The Related Arts

Thin-film transistor (TFT) liquid crystal display device is one of a variety of liquid crystal display devices and using TFT helps improve image quality. The core components of a TFT liquid crystal display device comprise a liquid crystal panel and the liquid crystal panel is composed of a TFT substrate, a color filter substrate, and a liquid crystal layer interposed between the two.

As shown in FIGS. 1 and 2, a TFT substrate comprises a substrate 10 and a signal line 11, a scan line 12, a pixel electrode 13, and a TFT (not labeled) that are formed on the substrate 10. The TFT comprises a gate terminal 14, a source terminal 15, and a drain terminal 16. The TFT functions as a switch for the pixel, controlling if the pixel electrode 13 generates an electric field and how the electrical field is generated. A via hole 17 is formed above the source terminal 15. The TFT and the via hole 17 are both arranged outboard the signal line 11 and the scan line 12, namely located within a pixel electrode zone enclosed by the signal line 11 and the scan line 12. The via hole 17 transmits a signal of the source terminal 15 of the TFT to the pixel electrode 13.

To meet the need of desired charge rate, it is better if the size of the TFT is greater. In the state of the art, since the TFT is located within the pixel electrode zone enclosed by the scan line 11 and the signal line 12, increasing the size of the TFT inevitably reduces the area of the pixel electrode zone and thus decreasing the opening ratio of the pixel. In addition, this may cause asymmetry of pixel quadrant in multi-domain division vertical alignment mode. The via hole 17 is located close to the display zone of the pixel and this makes it impossible for liquid crystal molecules to properly aligned, leading to a problem of image quality.

SUMMARY OF THE INVENTION

The primary technical issue to be addressed by the present invention is to provide a thin-film transistor (TFT) liquid crystal display device, a substrate, and a manufacturing method, which increase the opening ratio of pixel, alleviate asymmetry of pixel quadrant, and improve image quality.

To address the above technical issue, the present invention adopts a technical solution by providing a TFT liquid crystal display device, which comprises: a substrate and a signal line, a scan line, a pixel electrode, and a TFT formed on the substrate. The signal line and the scan line are arranged to intersect each other. The pixel electrode is located in a pixel display zone enclosed by the intersected signal line and scan line. The thin-film transistor includes a gate terminal, a source terminal, and a drain terminal. The gate terminal is electrically connected to the scan line. The drain terminal is electrically connected to the signal line. The source terminal is arranged at a position corresponding to the intersection of the signal line and the scan line and is electrically connected to the pixel electrode.

Wherein, the source terminal and the drain terminal are on the same metal layer of the substrate.

Wherein, the gate terminal and the drain terminal have projections on the substrate that are circular, elliptic, polygonal, or irregularly-shaped.

Wherein, the via hole has a diameter that is smaller than line width of the source terminal.

Wherein, the material of the transparent conductive layer is indium tin oxide film.

To address the above technical issue, the present invention adopts another technical solution by providing a thin-film transistor substrate of liquid crystal display device, which comprises a substrate and a signal line, a scan line, a pixel electrode, and a thin-film transistor that are formed on the substrate.

The signal line and the scan line are arranged to intersect each other. The pixel electrode is located in a pixel display zone enclosed by the intersected signal line and scan line. The thin-film transistor comprises a gate terminal, a source terminal, and a drain terminal. The gate terminal is electrically connected to the scan line. The drain terminal is electrically connected to the signal line. The source terminal is arranged at a position corresponding to the intersection of the signal line and the scan line and is electrically connected to the pixel electrode.

Wherein, the source terminal and the drain terminal are on the same metal layer of the substrate.

Wherein, the drain terminal completely encloses the source terminal and a via hole is formed above the drain terminal at the source terminal. The via hole is covered with a transparent conductive layer, whereby the source terminal is electrically connected by the via hole and the transparent conductive layer to the pixel electrode.

Wherein, the gate terminal and the drain terminal have projections on the substrate that are circular, elliptic, polygonal, or irregularly-shaped.

Wherein, the via hole has a diameter that is smaller than line width of the source terminal.

Wherein, the material of the transparent conductive layer is indium tin oxide film.

To address the above technical issue, the present invention adopts another technical solution by providing a method for manufacturing thin-film transistor liquid crystal display device, which comprises: depositing a first metal layer on a substrate to form a scan line and a gate terminal of a thin-film transistor, wherein the gate terminal is electrically connected to the scan line; sequentially depositing a first insulation layer, an active layer, an ohmic contact layer, and a second metal layer on the first metal layer to form a signal line and a source terminal and a drain terminal of the thin-film transistor, wherein the signal line and the scan line intersect each other, the source terminal is located at a position corresponding to the intersection of the signal line and the scan line, and the drain terminal is electrically connected to the signal line; depositing a second insulation layer on the second metal layer and forming a via hole above the source terminal, wherein the via hole extends through the second insulation layer above the source terminal; and depositing a transparent conductive layer on the second insulation layer and the via hole to form a pixel electrode, wherein the pixel electrode is located in a pixel display zone enclosed by the intersected signal line and scan line and the pixel electrode is electrically connected, through the via hole and the transparent conductive layer, to the source terminal.

Wherein, the step of forming the gate terminal and the drain terminal of the thin-film transistor comprises: forming the gate terminal and the drain terminal of the thin-film transistor in such a way that the gate terminal and the drain terminal have projections on the substrate that are circular, elliptic, polygonal, or irregularly-shape.

The efficacy of the present invention is that to be distinguished from the state of the art, the present invention arranges the source terminal of thin-film transistor at a position corresponding to the intersection of a signal line and a scan line to significantly reduce the amount of area of the pixel electrode occupied thereby and thus increasing the opening ratio of the pixel. Further, the positional arrangement of the source terminal makes the via hole not located in the pixel display zone and greatly reduces the influence on the alignment of the liquid crystal molecules thereby reducing asymmetry of the pixel quadrant and improving image quality.

DETAILED DESCRIPTION OF THE PREFERRED EMBODIMENTS

A detailed description of a thin-film transistor (TFT) liquid crystal display (LCD) device according to the present invention and a manufacturing method and a substrate thereof will be given below to more clearly address specifics and spirits of the present invention.

Figure 1:
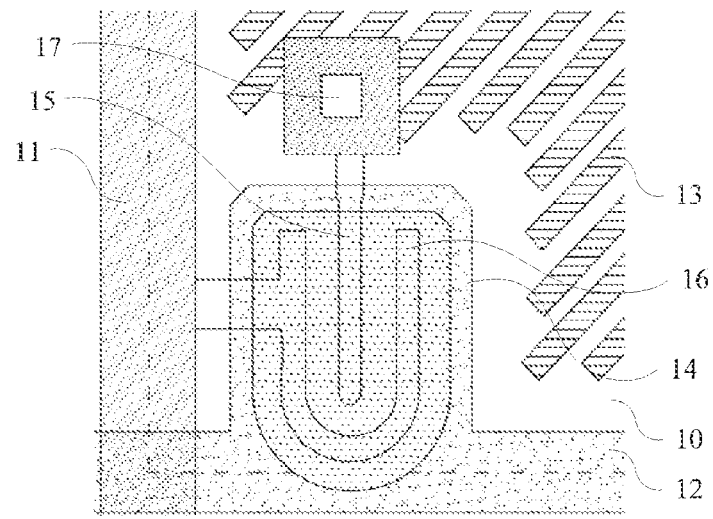
FIG. 1 is a schematic plan view of a conventional thin-film transistor of thin-film transistor liquid crystal display device.
Figure 2:
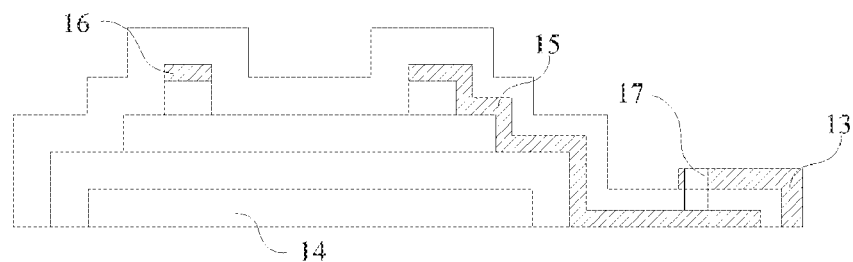
FIG. 2 is a cross-sectional view of the thin-film transistor of FIG. 1.
Figure 3:
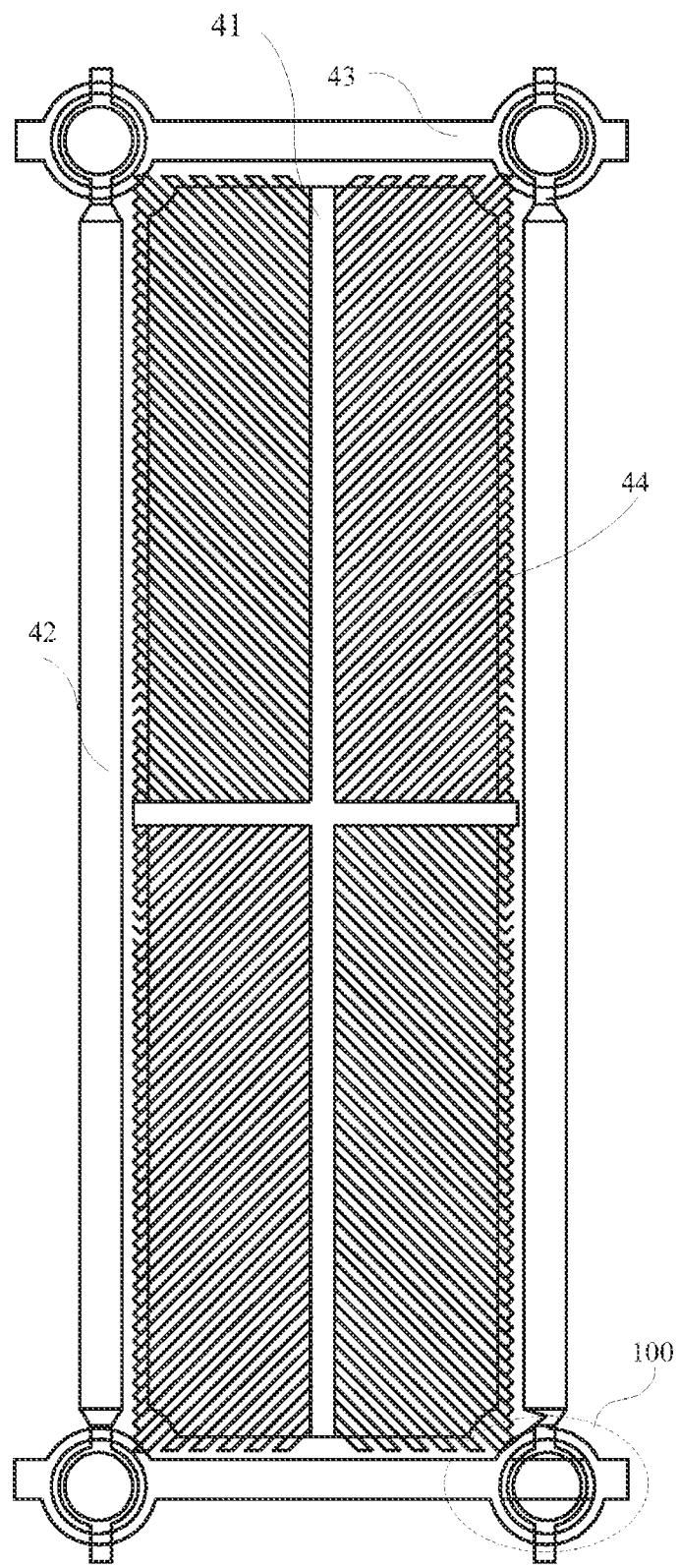
FIG. 3 is a schematic plan view showing a pixel electrode zone of an embodiment of thin-film transistor liquid crystal display device according to the present invention.

Referring to FIG. 3, FIG. 3 is a schematic plan view showing a pixel electrode zone of an embodiment of TFT LCD according to the present invention. Within the pixel electrode zone, a substrate 41, a signal line 42, a scan line 43, a pixel electrode 44, and a TFT 100 are arranged. The signal line 42 and the scan line 43 are arranged to intersect each other and the pixel electrode 44 is arranged in a pixel display zone enclosed by the intersected signal line 42 and the scan line 43. The TFT 100 is arranged at the intersection of the signal line 42 and the scan line 43. The TFT 100 serves as a switch of the pixel, controlling if the pixel electrode 44 generates an electric field and how the electric field is generated. The signal line 42 and the scan line 43 realize displaying through controlling the TFT 100.

Figure 4:
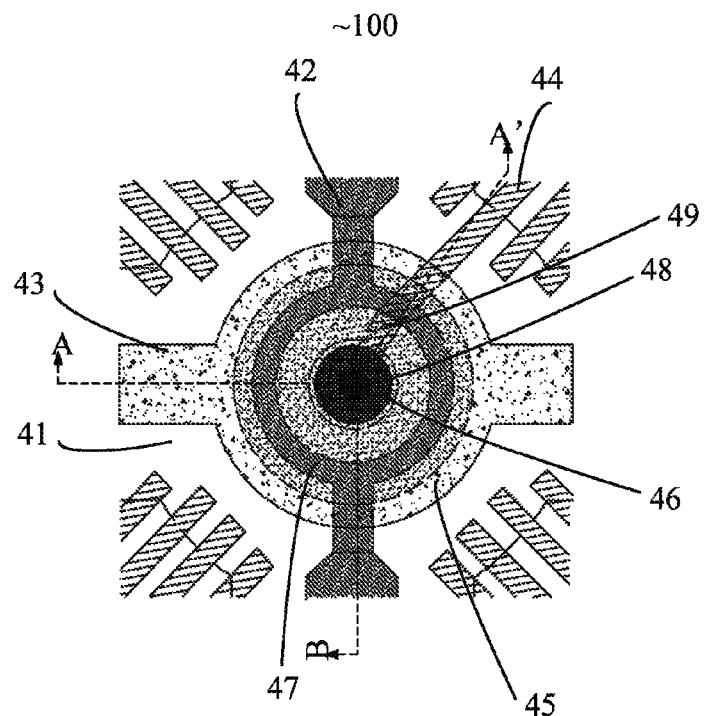
FIG. 4 is a schematic plan view of the thin-film transistor of the embodiment of thin film transistor liquid crystal display device according to the present invention.

Referring to FIG. 4, FIG. 4 is a schematic plan view of the TFT of the embodiment of TFT LCD according to the present invention. The TFT 100 comprises a gate terminal 45, a source terminal 46, and a drain terminal 47. The source terminal 46 and the drain terminal 47 are on the same metal layer. The gate terminal 45 and the drain terminal 47 are circular and can alternatively be elliptic, polygonal, or irregularly-shaped in other embodiments. It is also possible to further modify the shapes of the gate terminal 45 and the drain terminal 47 to meet the needs of design.

Figure 5:
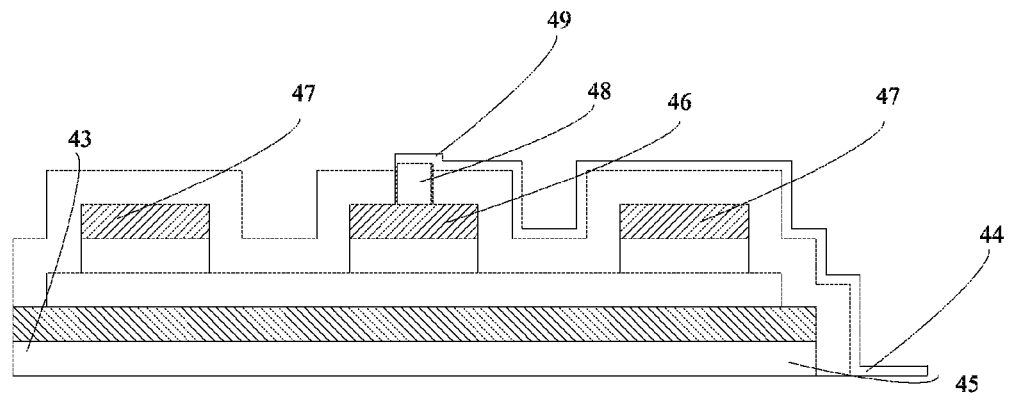
FIG. 5 is a cross-sectional view of the thin-film transistor taken along line A-A' of FIG. 4.
Figure 6:
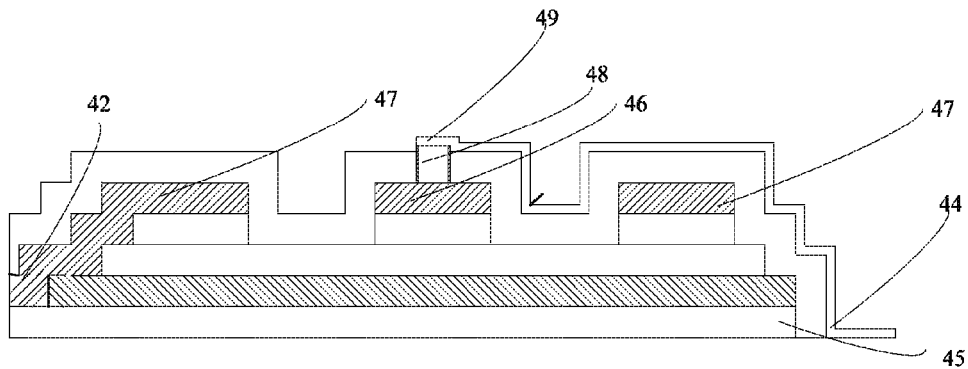
FIG. 6 is a cross-sectional view of the thin-film transistor taken along line B-B' of FIG. 4.

Referring collectively to FIGS. 5 and 6, the gate terminal 45 is electrically connected to the scan line 43. The drain terminal 47 is electrically connected to the signal line 42. The gate terminal 46 is arranged at a position corresponding to the intersection of the signal line 42 and the scan line 43 and is electrically connected to the pixel electrode 44. For the needs of design, the gate terminal 45 can be made to have a width that is greater than width of the scan line 43 in the direction of A-A' or alternatively have a width in the direction of A-A' that is smaller than the width of the scan line 43. Based on the size of the TFT 100, width of a channel can be determined and this in turn determines widths of the source terminal 46 and the drain terminal 47. Further, the scan line 43, the signal line 42, the gate terminal 45, the source terminal 46, and the drain terminal 47 are of such line widths that meet the needs of the art.

Continuously referring to FIGS. 5 and 6, the gate terminal 45 surrounds the drain terminal 47 and the drain terminal 47 completely encloses the source terminal 46 to form a closed configuration. Further, at the location of the source terminal 46, a via hole 48 is formed above he drain terminal 47. A transparent conductive layer 49 is formed covering the via hole 48. The transparent conductive layer 49 has a line width that is greater than the diameter of the via hole 48. The source terminal 46 is electrically connected, through the via hole 48 and the transparent conductive layer 49, to the pixel electrode 44. The diameter of the via hole 48 is less than the line width of the source terminal 46.

The present invention arranges the source terminal 46 at a position corresponding to the intersection of the signal line 42 and the 43 so as to greatly reduce the amount of area of the pixel electrode zone occupied thereby. Further, the positional arrangement of the TFT 100 makes the via hole 48 not located in the pixel display zone thereby greatly reducing the influence on the alignment of the liquid crystal molecules.

The structure and type of the TFT 100 described are just an example and can be used as the thin film transistor for various types of LCD, such as IPS or FFS thin-film transistors. The present invention imposes no specific limitation in this respect.

Further, the present invention also provides an embodiment of substrate for the TFT described above, which has a structure described above, namely comprising a substrate (not labeled), a signal line 42, a scan line 43, a pixel electrode 44, and a TFT 100. The signal line 42 and the scan line 43 are arranged to intersect each other and the pixel electrode 44 is located in the pixel display zone enclosed by the intersected signal line 42 and scan line 43. The TFT 100 comprises a gate terminal 45, a source terminal 46, and a drain terminal 47. The gate terminal 45 is electrically connected to the scan line 43. The drain terminal 47 is electrically connected to the signal line 42. The gate terminal 46 is arranged at a position corresponding to the intersection of the signal line 42 and the scan line 43 and is electrically connected to the pixel electrode 44.

Figure 7:
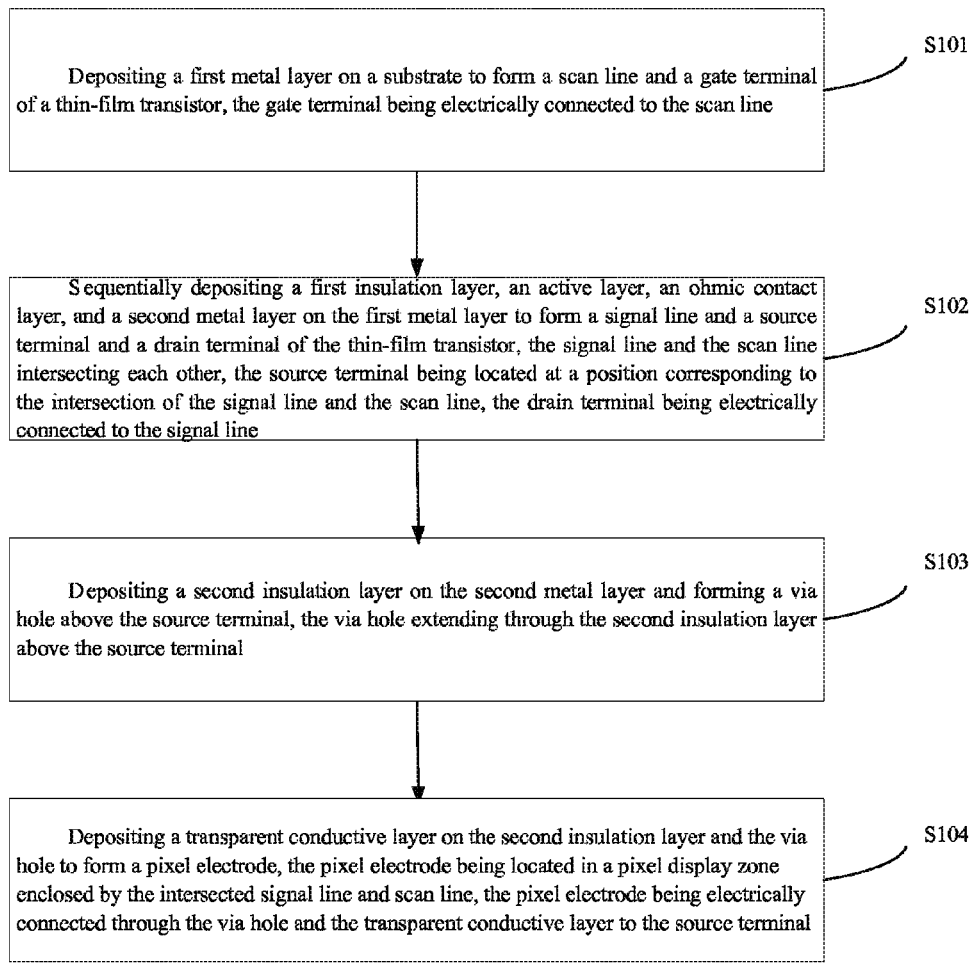
FIG. 7 is a flow chart illustrating a manufacturing method of the thin-film transistor liquid crystal display device according to the present invention.

FIG. 7 shows a flow chart of a manufacturing method of the TFT LCD according to the present invention. As shown, the present invention comprises the following steps:

Step S101, in which a first metal layer is deposited on a substrate to form a scan line and a gate terminal of a TFT, wherein the gate terminal is electrically connected to the scan line;

Step S102, in which a first insulation layer, an active layer, an ohmic contact layer, and a second metal layer are sequentially deposited on the first metal layer to form a signal line and a source terminal and a drain terminal of the TFT, wherein the signal line and the scan line intersect each other, the source terminal is located at a position corresponding to the intersection of the signal line and the scan line, and the drain terminal is electrically connected to the signal line;

Step S103, in which a second insulation layer is deposited on the second metal layer and a via hole is formed above the source terminal, wherein the via hole extends through the second insulation layer above the source terminal; and Step S104, in which a transparent conductive layer is deposited on the second insulation layer and the via hole to form a pixel electrode, wherein the pixel electrode is located in a pixel display zone enclosed by the intersected signal line and scan line and the pixel electrode is electrically connected, through the via hole and the transparent conductive layer, to the source terminal.

Specifically, the process can be realized with four-time photo mask techniques or five-time photo mask techniques.

In conducting step S101, as shown in FIGS. 5 and 6, the first metal layer can be deposited with magnetron sputtering method and the scan line and the gate terminal 45 of the TFT can be formed on the substrate by means of etching in such a way that the gate terminal 45 is electrically connected to the scan line. According to the needs of design, the gate terminal 45 may have a width in the direction of A-A' that is greater than the width of the scan line, or alternatively, the width in the direction of A-A' can be smaller than the width of the scan line. The shape of the gate terminal is circular and it is apparent that it can be elliptic, polygonal, or irregular shapes.

In conducting step S102, also referring to FIGS. 5 and 6, the first insulation layer, the active layer, and the ohmic contact layer can be realized by adopting chemical vapor deposition method. The ohmic contact layer is connected to the source terminal 46 and the drain terminal 47. The source terminal 46 and the drain terminal 47 are both on the second metal layer. The source terminal 46 is arranged at a position corresponding to the intersection of the signal line and the scan line and the drain terminal 47 is electrically connected to the signal line. The second metal layer and the first metal layer can be made of the same metal or they can be of different metals. According to the needs of design, width of a channel can be determined on the basis of the size of TFT and this in turn determines widths of the source terminal and the drain terminal.

In conducting step S103, also referring to FIGS. 5 and 6, the first insulation layer and the second insulation layer are made of the same insulation material. The via hole 48 has a diameter smaller than the size of the source terminal 46.

In conducting step S104, also referring to FIGS. 5 and 6, the material that makes the transparent conductive layer 49 is indium tin oxide (ITO) film. The pixel electrode 44 is located in the pixel display zone enclosed by the intersected signal line and scan line. After the transparent conductive layer 49 is deposited, the via hole 48 is filled up with the material of indium tin oxide film, whereby the pixel electrode 44 is electrically connected by the via hole 48 and the transparent conductive layer 49 to the source terminal 46.

To be distinguished from the state of the art, the present invention arranges the source terminal at a position corresponding to the intersection of the signal line and the scan line to reduce the amount of area of the pixel electrode 44 occupied thereby and thus increasing the opening ratio of the pixel. Further, the positional arrangement of the source terminal 46 makes the via hole 48 not located in the pixel display zone and greatly reduces the influence on the alignment of the liquid crystal molecules thereby reducing asymmetry of the pixel quadrant and improving image quality.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A thin-film transistor liquid crystal display device, comprising:
    a substrate and a signal line, a scan line, a pixel electrode, and a thin-film transistor that are formed on the substrate;
    the signal line and the scan line being arranged to intersect each other, the pixel electrode being located in a pixel display zone enclosed by the intersected signal line and scan line;
    the thin-film transistor comprising a gate terminal, a source terminal, and a drain terminal; and
    the gate terminal being electrically connected to the scan line, the drain terminal being electrically connected to the signal line, and the source terminal being arranged at a position corresponding to the intersection of the signal line and the scan line and electrically connected to the pixel electrode, the gate terminal surrounding the drain terminal, which in turn completely encloses the source terminal.

2. The liquid crystal display device as claimed in claim 1, wherein:
    the source terminal and the drain terminal are on the same metal layer of the substrate.

3. The liquid crystal display device as claimed in claim 2, wherein:
    a via hole is formed above the drain terminal at the source terminal, the via hole being covered with a transparent conductive layer, whereby the source terminal is electrically connected by the via hole and the transparent conductive layer to the pixel electrode.

4. The liquid crystal display device as claimed in claim 3, wherein:
    the gate terminal and the drain terminal have projections on the substrate that are circular, elliptic, polygonal, or irregularly-shaped.

5. The liquid crystal display device as claimed in claim 3, wherein:
    the via hole has a diameter that is smaller than line width of the source terminal.

6. The liquid crystal display device as claimed in claim 3, wherein:
    material of the transparent conductive layer is indium tin oxide film.

7. A method for manufacturing a thin-film transistor liquid crystal display device, comprising the following steps:
    depositing a first metal layer on a substrate to form a scan line and a gate terminal of a thin-film transistor, wherein the gate terminal is electrically connected to the scan line;
    sequentially depositing a first insulation layer, an active layer, an ohmic contact layer, and a second metal layer on the first metal layer to form a signal line and a source terminal and a drain terminal of the thin-film transistor, wherein the signal line and the scan line intersect each other, the source terminal is located at a position corresponding to the intersection of the signal line and the scan line, and the drain terminal is electrically connected to the signal line, the gate terminal surrounding the drain terminal, which in turn completely encloses the source terminal;

depositing a second insulation layer on the second metal layer and forming a via hole above the source terminal, wherein the via hole extends through the second insulation layer above the source terminal; and depositing a transparent conductive layer on the second insulation layer and the via hole to form a pixel electrode, wherein the pixel electrode is located in a pixel display zone enclosed by the intersected signal line and scan line and the pixel electrode is electrically connected, through the via hole and the transparent conductive layer, to the source terminal.

8. The method as claimed in claim 7, wherein:

the step of forming the gate terminal and the drain terminal of the thin-film transistor comprises: forming the gate terminal and the drain terminal of the thin-film transistor in such a way that the gate terminal and the drain terminal have projections on the substrate that are circular, elliptic, polygonal, or irregularly-shaped.

* * * * *